(12) United States Patent
Millard

(10) Patent No.: US 8,000,608 B2
(45) Date of Patent: Aug. 16, 2011

(54) INTEGRATED CIRCUIT FOR COMMUNICATIONS MODULES

(75) Inventor: Stuart James Millard, North Somerset (GB)

(73) Assignee: Phyworks Limited, Bristol (GB)

( * ) Notice: Subject to any disclaimer, the term of this patent is extended or adjusted under 35 U.S.C. 154(b) by 1355 days.

(21) Appl. No.: 11/088,463

(22) Filed: Mar. 23, 2005

(65) Prior Publication Data

US 2006/0216032 A1  Sep. 28, 2006

(51) Int. Cl.
*H04B 10/00* (2006.01)
(52) U.S. Cl. .................... 398/135; 398/138; 398/164
(58) Field of Classification Search .............. 398/164, 398/135–139
See application file for complete search history.

(56) References Cited

U.S. PATENT DOCUMENTS

| | | | |
|---|---|---|---|
| 7,224,904 B1 * | 5/2007 | Giaretta et al. | 398/135 |
| 7,224,910 B2 * | 5/2007 | Sherazi et al. | 398/207 |
| 2001/0030789 A1 * | 10/2001 | Jiang et al. | 359/152 |
| 2006/0094222 A1 * | 5/2006 | Wong et al. | 438/601 |
| 2009/0003761 A1 * | 1/2009 | Matsuoka et al. | 385/14 |

OTHER PUBLICATIONS

Vitesse Semiconductor Corporation. "Vitesse. SFP PRO™ Chipset and Reference Design." Oct. 2004; 1-19.

* cited by examiner

*Primary Examiner* — Dzung D Tran
(74) *Attorney, Agent, or Firm* — TIPS Group

(57) ABSTRACT

An integrated circuit product, for bidirectional communication, has two inputs and two outputs. The first input is located on a first edge of the integrated circuit product. The first output is located on a second edge of the integrated circuit product, the second edge being located adjacent to the first edge. The second input is located on a third edge of the integrated circuit product, the third edge being opposite the first edge. The second output is located on a fourth edge of the integrated circuit product, the fourth edge being opposite the second edge. The integrated circuit product can be mounted diagonally in a transceiver module, allowing straight signals paths from the inputs and outputs of the integrated circuit product to the corresponding inputs and outputs of the transceiver module. The inputs and outputs of the integrated circuit product can be located in the respective centre regions of their respective edges, so that connection pads of the integrated circuit within the integrated circuit product can be connected to the package landings of the integrated circuit product by means of the shortest available bond wires.

27 Claims, 2 Drawing Sheets

INTEGRATED CIRCUIT FOR COMMUNICATIONS MODULES

TECHNICAL FIELD OF THE INVENTION

This invention relates to an integrated circuit, for use in a communications module. In another aspect, the invention relates to a communications module, in particular an optical transceiver module, incorporating the integrated circuit.

BACKGROUND OF THE INVENTION

It is known in the field of optical communications to provide an optical transceiver module, that is, a device that can act as both a transmitter and a receiver, in the form of a rectangular circuit board, with electrical connectors at one of the ends of the circuit board and with optical components at the opposite end of the circuit board. Optical transceiver modules typically have one of a number of standard forms, examples being Small Form Factor (SFF) modules and pluggable Small Form Factor (SFP) modules. These standard forms have known dimensions.

The optical components include transmitter optical components, for example including a laser for generating an optical signal for transmission along an optical fiber. The optical components also include receiver optical components, for example including a photodetector, for converting optical signals received along the optical fiber into electronic signals.

The electrical connectors include an input connection, for receiving an input electronic signal, and an output connection, for passing an output signal to further electronic devices.

The optical transceiver module then includes an integrated circuit, which includes signal processing functionality. For example, the integrated circuit may include an amplifier, for amplifying received electronic signals from the receiver optical components, such that they are suitable for passing to the output electrical connection. The integrated circuit may further include driver circuitry, for receiving an input electronic signal from the input electrical connectors, and for converting the received signal into a form suitable for passing to the transmitter optical components.

Integrated circuits are typically provided in the form of integrated circuit packages, in which pads on the integrated circuit itself are connected by means of bond wires to package landings, and then to connectors such as pins, around the periphery of the package. It is necessary for the integrated circuit package to be able to fit into the standard dimensions of the optical transceiver modules in which it is intended to be used.

One known integrated circuit of this type is the VSC7964 circuit, available from Vitesse Semiconductor Corporation.

However, one disadvantage with the use of the known integrated circuits is that they can not conveniently be fitted into the optical transceiver modules in which they are intended to be used. Specifically, the integrated circuits are intended to operate at very high speeds, for example receiving and transmitting data at rates of 1 GBps or more. At these high data rates, it is highly desirable for the electrical signal paths on the optical transceiver modules to be as short and straight, and as well-matched in length, as possible. In the case of the known integrated circuit packages, however, their use in an optical transceiver module requires the use of signal paths which are not straight, and whose lengths differ.

Moreover, it is advantageous for the bond wires, connecting the pads on the integrated circuit itself to the package landings around the periphery of the package, to be as short, and as well-matched in length, as possible. However, this is difficult to implement in a way which allows use of the integrated circuit package in an optical transceiver module.

SUMMARY OF THE INVENTION

According to one aspect of the present invention, there is provided an integrated circuit product, for passing signals from a first input to a first output after processing, and for passing signals from a second input to a second output after processing, wherein:

the first input is located on a first edge of the integrated circuit product;
the first output is located on a second edge of the integrated circuit product, the second edge being located adjacent to the first edge;
the second input is located on a third edge of the integrated circuit product, the third edge being opposite the first edge;
the second output is located on a fourth edge of the integrated circuit product, the fourth edge being opposite the second edge.

This has the advantage that the integrated circuit product can be mounted diagonally in a transceiver module, allowing straight signals paths from the inputs and outputs of the integrated circuit product to the corresponding inputs and outputs of the transceiver module.

Advantageously, the inputs and outputs of the integrated circuit product can be located in the respective centre regions of their respective edges.

This has the advantage that connection pads of the integrated circuit within the integrated circuit product can be connected to the package landings of the integrated circuit product by means of the shortest available bond wires.

According to another aspect of the present invention, there is provided a transceiver module, having a first end and a second end, and comprising an integrated circuit product, for passing signals from a first input to a first output after processing, and for passing signals from a second input to a second output after processing, wherein:

the first input is located on a first edge of the integrated circuit product;
the first output is located on a second edge of the integrated circuit product, the second edge being located adjacent to the first edge;
the second input is located on a third edge of the integrated circuit product, the third edge being opposite the first edge;
the second output is located on a fourth edge of the integrated circuit product, the fourth edge being opposite the second edge; and
wherein the integrated circuit product is mounted in the transceiver module with the edges of the integrated circuit product at an angle to the ends of the transceiver module, said angle being in the range of 30° to 60°.

DETAILED DESCRIPTION OF PREFERRED EMBODIMENTS

Figure 1:
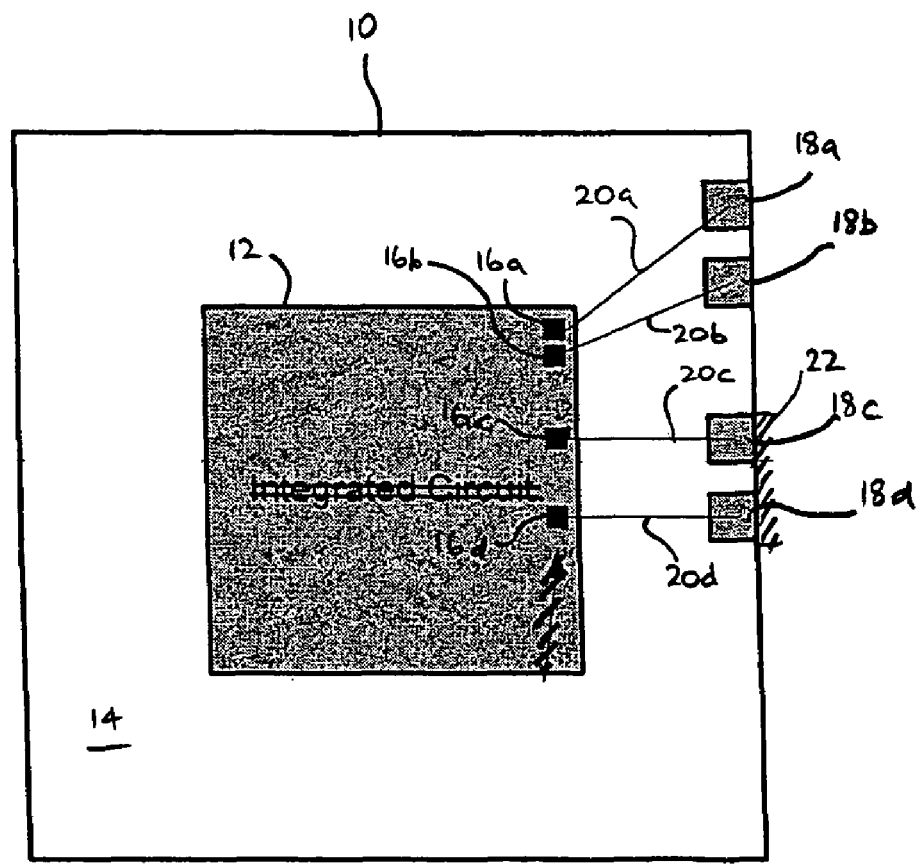
FIG. 1 is a block schematic diagram of an integrated circuit product, in accordance with an aspect of the present invention.

FIG. 1 shows the general form of an integrated circuit product in accordance with the invention. As is conventional, the integrated circuit product 10 includes an integrated circuit 12, plus suitable packaging 14. Techniques for manufacturing integrated circuits, and for packaging them to form integrated circuit products are well known in the art.

As is conventional, the integrated circuit 12 includes pads located around its periphery. FIG. 1 shows only four of these pads 16a, 16b, 16c, 16d for simplicity. Further, as is conventional, each of the pads 16a, 16b, 16c, 16d is connected to a respective package landing 18a, 18b, 18c, 18d around the periphery of the integrated circuit product 10 by means of a respective bond wire 20a, 20b, 20c, 20d. The package landings 18a, 18b, 18c, 18d are then connected to respective pins (not shown) of the integrated circuit product 10.

It will be noted that the bond wires 20c, 20d, connecting the pads 16c, 16d to the landings 18c, 18d are the same length as each other, and are shorter than the bond wires 20a, 20b connecting the pads 16a, 16b to the landings 18a, 18b, which are slightly different lengths.

In the case of an integrated circuit product which is handling high speed electronic signals, it is advantageous to use bond wires which are as short as possible. Further, when the integrated circuit product is handling differential electronic signals, that is, where the value of a signal is determined by the difference between the signal levels on two signal lines, it is advantageous for the bond wires to these two signal lines to be as similar in length as possible.

In the case of the product shown in FIG. 1, it is clear that it is preferable for these signal lines to be connected to the pins connected to the landings 18c, 18d rather than to the pins connected to the landings 18a, 18b, and in general terms that it is advantageous for these signal lines to be connected to pins in the central region of the respective side of the integrated circuit product.

In FIG. 1, the pins connected to the landings 18a, 18b lie within a central region 22 of the side 24 of the product 10, where the central region 22 has a length that is approximately 20% of the length of the side of the product. In other embodiments of the invention, the central region 22 may have a length that is 20-30%, or 30-40%, or 40-50% of the length of the side of the product.

Figure 2:
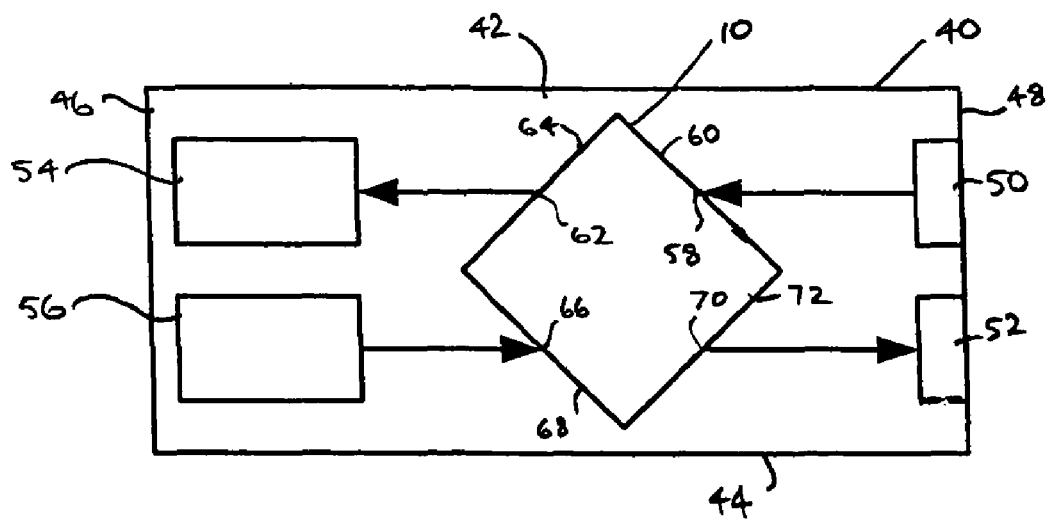
FIG. 2 is a block schematic diagram of a transceiver module, in accordance with a further aspect of the present invention.

FIG. 2 shows an optical communications transceiver module 40, according to an aspect of the present invention, incorporating the integrated circuit product 10 as shown in FIG. 1.

The optical transceiver module 40 takes the form of a generally rectangular circuit board, having long sides 42, 44 and shorter ends 46, 48, with electrical connectors 50, 52 at one of the ends 48 of the circuit board and with optical components 54, 56 at the opposite end 46 of the circuit board. The optical transceiver module has a standard form, such as a Small Form Factor (SFF) or Small Form Pluggable (SFP) form. These standard forms have known dimensions.

The electrical connectors include a transmitter input 50, for receiving an electrical input signal, corresponding to an optical signal to be transmitted, and a receiver output 52, for outputting an electrical output signal, corresponding to a received optical signal.

The optical components include transmitter optical components 54, for example including a laser for generating an optical signal for transmission along an optical fiber, to which the module 40 is connected, the optical fiber not being shown in FIG. 2. The optical components also include receiver optical components 56, for example including a photodetector, for converting optical signals received along the optical fiber into electronic signals.

The integrated circuit product 10 includes signal processing functionality. For example, the integrated circuit may include an amplifier, for amplifying received electronic signals from the receiver optical components 56, such that they are suitable for passing to the output electrical connection 52. The integrated circuit may further include driver circuitry, for receiving an input electronic signal from the input electrical connectors 50, and for converting the received signal into a form suitable for passing to the transmitter optical components 54.

The general functionality of the integrated circuit product 10 is known to the person skilled in the art, and will not be described further herein.

As shown in FIG. 2, the integrated circuit product 10 is rectangular, and more specifically is generally square. The integrated circuit product 10 has a first input 58, located on a first edge 60 of the integrated circuit product, for connection to the transmitter input 50. The integrated circuit product 10 also has a first output 62, located on a second edge 64 of the integrated circuit product, for connection to the transmitter optical components 54. The second edge 64 is located adjacent to the first edge 60. The integrated circuit product 10 also has a second input 66, located on a third edge 68 of the integrated circuit product, for connection to the receiver optical components 56. The third edge 68 is opposite the first edge 60. The integrated circuit product 10 also has a second output 70, located on a fourth edge 72 of the integrated circuit product, for connection to the receiver output 52. The fourth edge 72 is opposite the second edge 64.

The components of the integrated circuit product 10 therefore define a transmitter signal path, between the first input 58 and the first output 62, and a receiver signal path, between the second input 66 and the second output 70.

It will also be noted that the first input 58 is located in a central region of the first edge 60 of the integrated circuit product. The first output 62 is located in a central region of the second edge 64 of the integrated circuit product. The second input 66 is located in a central region of the third edge 68 of the integrated circuit product. The second output 70 is located in a central region of the fourth edge 72 of the integrated circuit product.

In each case, in this illustrated embodiment, the central region has a length that is approximately 20% of the length of the side of the product but the central regions may have lengths that are 20-30%, or 30-40%, or 40-50% of the length of the respective sides of the product.

Further, as shown in FIG. 2, the integrated circuit product 10 is mounted in the transceiver module 40 with the edges 60, 64, 68, 72 of the integrated circuit product at an acute angle to the sides 42, 44 and the ends 46, 48 of the transceiver module. In this illustrated embodiment, the acute angle is approximately 45°, but the angle can advantageously take any value in the range of 30° to 60°.

The distribution of the inputs 58, 66 and outputs 62, 70 between the edges 60, 64, 68, 72 of the integrated circuit product 10 means that the inputs and outputs can all be located in the central regions of their respective sides of the integrated circuit product 10, while still allowing the connections between the inputs 58, 66 and outputs 62, 70 and the respective receiver and transmitter components 50, 56, 54, 52 to which they are connected.

As described above, the location of the inputs and outputs in the central regions of their respective sides of the integrated circuit product in turn means that the bond wires connecting the corresponding pads on the integrated circuit itself to the pins on the integrated circuit product 10 can be made as short as possible.

Figure 3:
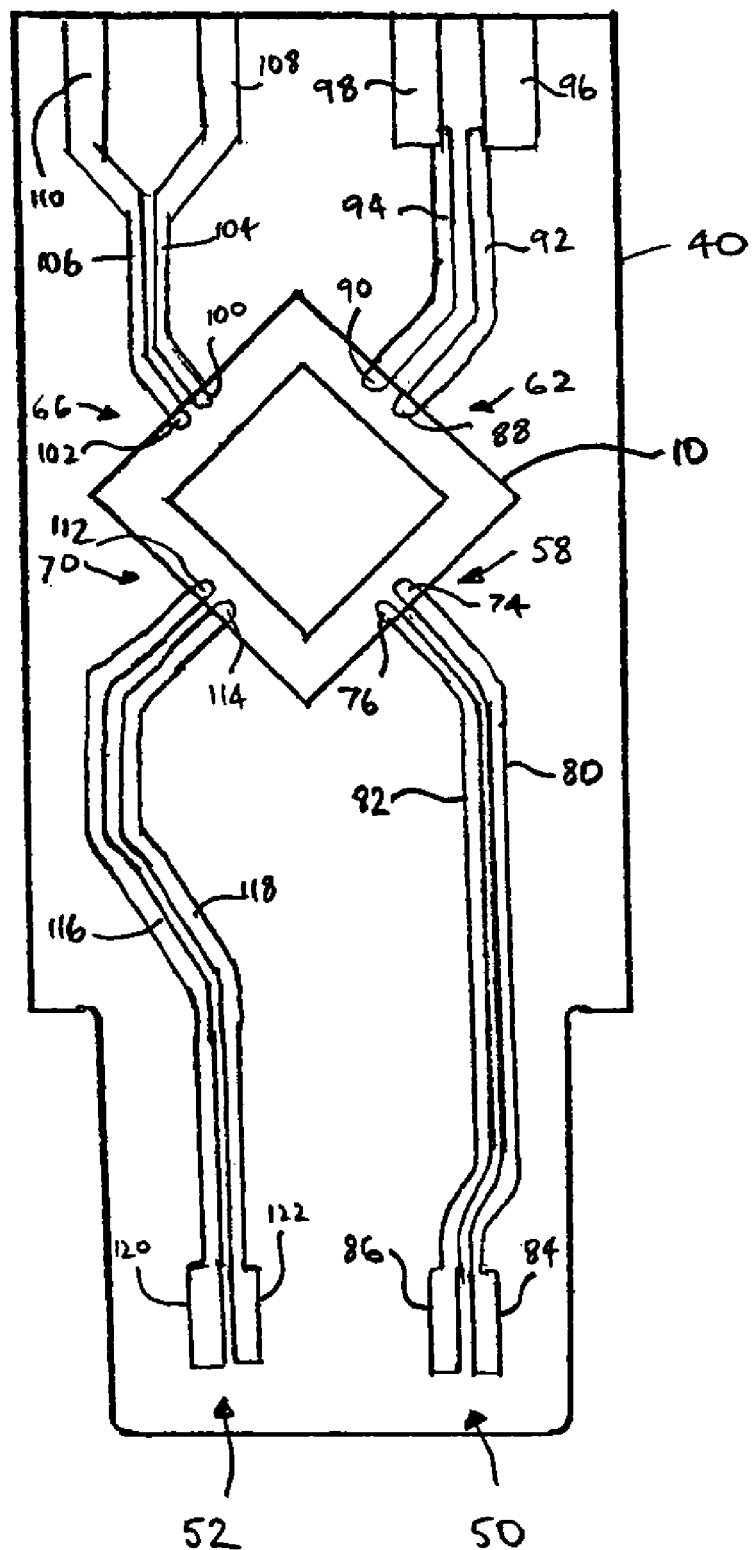
FIG. 3 is a more detailed schematic diagram of the transceiver module of FIG. 2.

FIG. 3 shows in more detail a part of the structure of the transceiver module 40. In this illustrated embodiment of the invention, the module is adapted for use with differential signals. That is, data is transferred on a pair of signal lines, with the data value being determined by the difference between the signal levels on those two lines at any one point in time. The use of differential signals in this way is conventional, and will not be described further herein.

The location of the inputs and outputs in the central regions of their respective sides of the integrated circuit product further means that the pairs of bond wires, connecting the corresponding pairs of pads on the integrated circuit itself to the pairs of pins on the integrated circuit product 10 can be made as nearly as possible equal in length, as illustrated in FIG. 1.

Thus, in FIG. 3, the first input 58 comprises a pair of pins 74, 76, connected by generally straight tracks 80, 82 on the circuit board to connectors 84, 86 forming the transmitter input 50. The output 62 comprises a pair of pins 88, 90, connected by generally straight tracks 92, 94 on the circuit board to connectors 96, 98 for the transmitter optical components 54 (not shown in FIG. 3). The second input 66 comprises a pair of pins 100, 102, connected by generally straight tracks 104, 106 on the circuit board to connectors 108, 110 for the receiver optical components 56 (not shown in FIG. 3). The second output 70 comprises a pair of pins 112, 114, connected by generally straight tracks 116, 118 on the circuit board to connectors 120, 122 forming the receiver output 52. It will of course be appreciated that the module 40 contains many other signal processing and other components, which are generally conventional, and are omitted from this description for ease of understanding.

It can therefore be seen that the distribution of the inputs 58, 66 and outputs 62, 70 between the edges 60, 64, 68, 72 of the integrated circuit product 10, and the mounting of the integrated circuit product 10 in the transceiver module 40 with its edges at an angle of approximately 45° to the sides of the transceiver module, means that the pairs of tracks 80, 82; 92, 94; 104, 106; and 116, 118 can all be generally straight, in the sense that they do not need to bend through right angles, as they would with conventional arrangements.

The invention has been described with reference to an integrated circuit, and a transceiver module, for use in opto-electronic communications. However, it will be appreciated that the invention is equally applicable to any communications system, and in particular to any bidirectional communications system, where an integrated circuit has a pair of inputs and a pair of outputs, with a signal path from one input to one output, and from the other input to the other output.

The advantages of the present invention are particularly apparent when the communication is at a high data rate, for example in excess of 1 Gbps or in excess of 4 Gbps, and when the communication relies on pairs of differential electrical signals, but is not limited to such uses.

The invention claimed is:

1. A transceiver integrated circuit product for signal processing, comprising:
   a first input located on a first edge of the integrated circuit product;
   a first output located on a second edge of the integrated circuit product, the second edge being located adjacent to the first edge;
   a second input located on a third edge of the integrated circuit product, the third edge being opposite the first edge;
   a second output located on a fourth edge of the integrated circuit product, the fourth edge being opposite the second edge;
   wherein said integrated circuit product is configured so as to provide a transmitter signal path for electrical signals from said first input to said first output and is configured so as to provide a receiver signal path for electrical signals from said second input to said second output.

2. An integrated circuit product as claimed in claim 1, wherein at least two of the first and second inputs and the first and second outputs are located in respective central regions of the respective edges of the integrated circuit product.

3. An integrated circuit product as claimed in claim 2, wherein the respective central regions have lengths which are less than 50% of the length of the respective edge of the integrated circuit product.

4. An integrated circuit product as claimed in claim 3, wherein the respective central regions have lengths which are less than 40% of the length of the respective edge of the integrated circuit product.

5. An integrated circuit product as claimed in claim 4, wherein the respective central regions have lengths which are less than 30% of the length of the respective edge of the integrated circuit product.

6. An integrated circuit product as claimed in claim 5, wherein the respective central regions have lengths which are approximately 20% of the length of the respective edge of the integrated circuit product.

7. An integrated circuit product as claimed in claim 1, wherein at least three of the first and second inputs and the first and second outputs are located in respective central regions of the respective edges of the integrated circuit product.

8. An integrated circuit product as claimed in claim 7, wherein the respective central regions have lengths which are less than 50% of the length of the respective edge of the integrated circuit product.

9. An integrated circuit product as claimed in claim 8, wherein the respective central regions have lengths which are less than 40% of the length of the respective edge of the integrated circuit product.

10. An integrated circuit product as claimed in claim 9, wherein the respective central regions have lengths which are less than 30% of the length of the respective edge of the integrated circuit product.

11. An integrated circuit product as claimed in claim 10, wherein the respective central regions have lengths which are approximately 20% of the length of the respective edge of the integrated circuit product.

12. An integrated circuit product as claimed in claim 1, wherein the first and second inputs and the first and second outputs are each located in respective central regions of the respective edges of the integrated circuit product.

13. An integrated circuit product as claimed in claim 12, wherein the respective central regions have lengths which are less than 50% of the length of the respective edge of the integrated circuit product.

14. An integrated circuit product as claimed in claim 13, wherein the respective central regions have lengths which are less than 40% of the length of the respective edge of the integrated circuit product.

15. An integrated circuit product as claimed in claim 14, wherein the respective central regions have lengths which are less than 30% of the length of the respective edge of the integrated circuit product.

16. An integrated circuit product as claimed in claim 15, wherein the respective central regions have lengths which are approximately 20% of the length of the respective edge of the integrated circuit product.

17. A transceiver integrated circuit product for signal processing, comprising:
   a first input and a first output, and a first defined electrical signal path between the first input and the first output; and
   a second input and a second output, and a second defined electrical signal path between the second input and the second output, wherein:
   the first input is located on a first edge of the integrated circuit product;
   the first input comprises a first pair of pins for receiving a differential electrical signal relating to a transmission signal;
   the first output is located on a second edge of the integrated circuit product, the second edge being located adjacent to the first edge;
   the first output comprises a second pair of pins for supplying a differential electrical signal to optical components, relating to the transmission signal;
   the second input is located on a third edge of the integrated circuit product, the third edge being opposite the first edge;
   the second input comprises a third pair of pins for receiving a differential electrical signal from optical components, relating to a received signal;
   the second output is located on a fourth edge of the integrated circuit product, the fourth edge being opposite the second edge; and
   the second output comprises a fourth pair of pins for supplying a differential electrical signal relating to the received signal.

18. An integrated circuit product as claimed in claim 17, wherein the first and second inputs and the first and second outputs are each located in respective central regions of the respective edges of the integrated circuit product.

19. An integrated circuit product as claimed in claim 18, wherein the respective central regions have lengths which are less than 50% of the length of the respective edge of the integrated circuit product.

20. An integrated circuit product as claimed in claim 19, wherein the respective central regions have lengths which are less than 40% of the length of the respective edge of the integrated circuit product.

21. An integrated circuit product as claimed in claim 19, wherein the respective central regions have lengths which are less than 30% of the length of the respective edge of the integrated circuit product.

22. An integrated circuit product as claimed in claim 21, wherein the respective central regions have lengths which are approximately 20% of the length of the respective edge of the integrated circuit product.

23. An integrated circuit product as claimed in claim 17, wherein said integrated circuit product handles received electrical signals at a data rate in excess of 1 Gbps.

24. An integrated circuit product as claimed in claim 23, wherein said integrated circuit product handles received electrical signals at a data rate in excess of 4 Gbps.

25. An optoelectronic transceiver module, comprising:
   a generally rectangular circuit board, the circuit board having a first end and a second end, with first and second connections for electrical components at the first end and first and second connections for optical components at the second end, and
   a generally rectangular integrated circuit product comprising an integrated circuit attached to a package and having four major edges, said integrated circuit product having a first input and a first output and a first defined signal path therebetween, and having a second input and a second output and a second defined signal path therebetween, wherein:
   the first input is located on a first edge of the integrated circuit product;
   the first output is located on a second edge of the integrated circuit product, the second edge being located adjacent to the first edge;
   the second input is located on a third edge of the integrated circuit product, the third edge being opposite the first edge;
   the second output is located on a fourth edge of the integrated circuit product, the fourth edge being opposite the second edge; and
   wherein the integrated circuit product is mounted in the transceiver module with the edges of the integrated circuit product at an angle to the ends of the transceiver module, said angle being in the range of 30° to 60°, with the first input and the second output of the integrated circuit product being directed towards the first end of the transceiver module and electrically connected to said first and second connections for electrical components respectively, and with the first output and the second input of the integrated circuit product being directed towards the second end of the transceiver module and electrically connected to said first and second connections for optical components respectively.

26. An optoelectronic transceiver module as claimed in claim 25, wherein the integrated circuit product is mounted in the transceiver module with the edges of the integrated circuit product at an angle to the ends of the transceiver module, and wherein said angle is in the range of 40° to 50°.

27. An optoelectronic transceiver module as claimed in claim 25, wherein the first and second inputs and the first and second outputs are each located in respective central regions of the respective edges of the integrated circuit product.

* * * * *